미국 특허 (United States Patent)

United States Patent [19]
Menon et al.

[11] Patent Number: 5,497,108
[45] Date of Patent: Mar. 5, 1996

[54] BICMOS REPEATER CIRCUIT FOR A PROGRAMMABLE LOGIC DEVICE

[75] Inventors: Suresh M. Menon, Sunnyvale; Stanley Wilson, Mountain View; Tsung C. Whang, Cupertino, all of Calif.

[73] Assignee: Dynalogic Corporation, Sunnyvale, Calif.

[21] Appl. No.: 352,402

[22] Filed: Dec. 8, 1994

[51] Int. Cl.$^6$ ............................................. H03K 19/0175
[52] U.S. Cl. ................................ 326/84; 326/39; 326/86
[58] Field of Search .................................. 326/39, 44, 84, 326/86

[56] References Cited

U.S. PATENT DOCUMENTS

| | | | |
|---|---|---|---|
| 3,967,059 | 6/1976 | Moore, III et al. | 328/197 |
| 4,713,557 | 12/1987 | Carter | 307/475 |
| 4,761,615 | 8/1988 | Maloberti | 307/475 |
| 5,202,593 | 4/1993 | Huang | 307/475 |
| 5,218,240 | 6/1993 | Camarota | 307/443 |
| 5,306,967 | 4/1994 | Dow | 307/443 |
| 5,341,040 | 8/1994 | Garverick | 326/44 |

*Primary Examiner*—Edward P. Westin
*Assistant Examiner*—Andrew Sanders
*Attorney, Agent, or Firm*—Townsend and Townsend and Crew

[57] ABSTRACT

A programmable logic device includes a plurality of logic cells in which logic functions are performed, a plurality of input lines for supplying signals to be processed by the logic cells, a plurality of output lines for receiving signals that have been processed by the logic cells, and a plurality of repeater circuits combining bipolar and CMOS transistor technologies for transferring data from one point in the PLD to another point. Unidirectional repeater circuits transfer data from a first data bus in the PLD to a second data bus in the PLD. Bidirectional repeater circuits maintain signal integrity by transferring data along the length of a single PLD data bus. The bipolar technology in the repeater circuits provides superior speed in data transfer, while the CMOS technology limits power consumption of the repeater circuits.

16 Claims, 4 Drawing Sheets

BICMOS REPEATER CIRCUIT FOR A PROGRAMMABLE LOGIC DEVICE

BACKGROUND OF THE INVENTION

This invention relates to programmable logic, and in particular to a high speed programmable logic device architecture employing BiCMOS repeater circuits in the interconnection array.

A programmable logic device (PLD) is a programmable integrated circuit that allows the user of the circuit to customize the logic functions the circuit will perform. The logic functions previously performed by small, medium and large scale integration integrated circuits are now capable of being performed by programmable logic devices. PLDs now have a capacity on the order of 50,000 gates per integrated circuit. When a typical programmable logic device is supplied by an integrated circuit manufacturer, it is not yet capable of performing any specific function. The user can program the PLD to perform the specific function or functions required by the user's application. The PLD then can function in a larger system designed by the user, just as though dedicated logic chips were employed. This functionality allows the user to debug the system logic without committing the time or expense of custom chips or gate arrays. It also allows small production runs, and the customization of hardware to suit a very specific application. In some PLD's the logic can be changed "on-the-fly" enabling the PLD to perform one function at one time during system operation, and another function at a later time.

A typical PLD consists of an array of identical logic cells that can be individually programmed and arbitrarily interconnected to each other to provide internal input and output signals, thus permitting the performance of highly complex combinational and sequential logic functions. The program is implemented in the PLD by setting the states of programmable elements such as memory cells.

Connections between logic cells, as well as between logic cells and the inputs and outputs of the PLD, are established via data buses that run throughout the PLD. For example, U.S. patent application Ser. No. 08/188,499 to Sasaki, also assigned to the Assignee of this application and incorporated here in its entirety by reference, discloses a grid-like bus structure where a set of horizontal bus lines transfers inputs to logic cells and a set of vertical bus lines accepts outputs from logic cells. To transfer data from one bus to another, some interconnection between buses must be established.

A possible means of interconnecting buses is a buffer or repeater circuit that will accept input data from one bus and supply that data to the other bus. Such a repeater circuit can also be equipped with a programmable enable input to control the operation of the repeater circuit.

A repeater can also be used to retransmit data along a bus to compensate for possible dissipation of the integrity of a data signal or noise as the signal travels along the length of the bus. For example, the repeater will boost a HIGH logic signal presented at its input to the original maximum level generated by the source of the signal so that at the final destination of the signal, whether it is another logic cell or a PLD output, a clean HIGH logic signal is received. A repeater circuit that transfers data along one bus, rather than from one bus to another, will be a bidirectional repeater, if data will be permitted to be transferred in either direction on the bus. Thus, the bidirectional repeater can be enabled to permit the transfer of data in either direction on a data bus.

In the prior art, it is known to construct repeaters in a PLD. For example, U.S. Pat. No. 4,317,557 to Carter discloses a CMOS buffer in a PLD. CMOS technology provides the benefit of reduced power consumption by the PLD, but does not provide the speed required for many applications. Bipolar technology, on the other hand, provides substantial speed benefits, but draws more power during circuit operation.

As PLDs are increasingly used in applications that require superior speed performance, it would be desirable to have a PLD with repeater circuits that can operate at high speeds but do not draw an excessive amount of power during circuit operation.

SUMMARY OF THE INVENTION

An architecture has been developed for programmable logic devices which includes BiCMOS repeater circuits that transfer data within a PLD. BiCMOS technology combines bipolar transistors and CMOS transistors in one device to gain the benefits of the speed of bipolar technology and the low power consumption of CMOS technology.

A first embodiment of the invention includes unidirectional repeater circuits that transfer data from a vertical bus, which receives output signals from a logic cell, to a second bus, which presents input signals to a logic cell. The unidirectional repeaters include both bipolar transistors and CMOS transistors. The bipolar technology provides superior speed in data transfer, while the CMOS technology limits power consumption of the repeater circuit.

A second embodiment of the invention is directed to BiCMOS bidirectional repeater circuits that transfer data along the length of a single wire PLD data bus. Bidirectional repeaters, as the name implies, can drive data in either direction along the length of a bus. By repeating a data signal on a bus, the bidirectional repeaters maintain data signal integrity while the data travels along the bus on the PLD chip. Also, by disabling selected bidirectional repeaters, it is possible to isolate a set of logic cells from the remaining logic cells in the PLD. This permits isolation of one portion of the logic from another until a desired "downstream" point. As was the case above, the bipolar transistors provide superior data transmission speed, while the CMOS transistors limit power consumption of the bidirectional repeater circuit.

A third embodiment of the invention is directed to bidirectional repeater circuits that transfer data along the length of a differential wire pair PLD data bus. The advantages outlined above for the single-ended bus also apply to the bidirectional repeaters used in the differential bus implementation.

The invention will be better understood by reference to the following detailed description in connection with the accompanying drawings.

DESCRIPTION OF THE PREFERRED EMBODIMENTS

Figure 1:
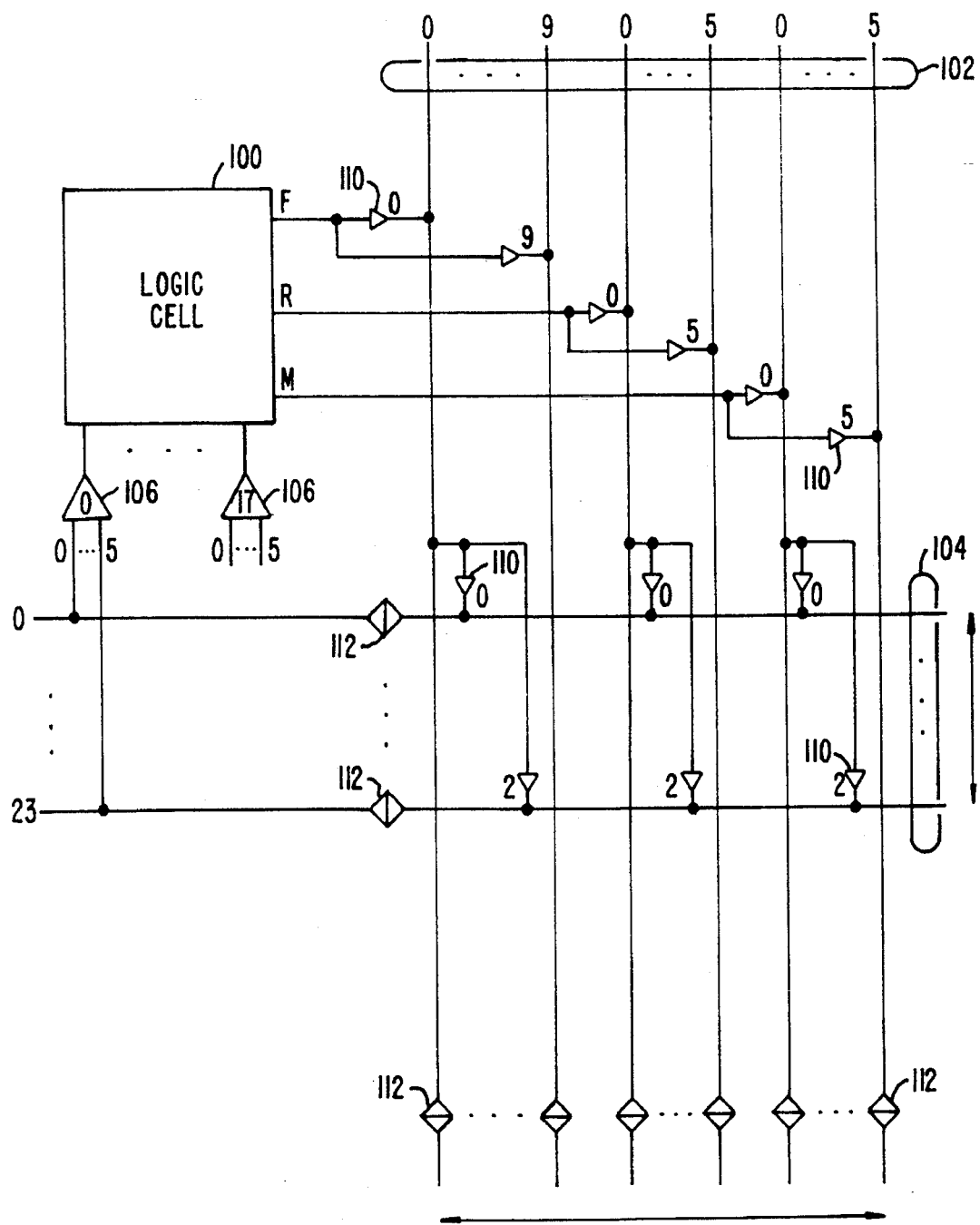
FIG. 1 is a block diagram showing a portion of a programmable logic device (PLD) and the connections between a logic cell and bus structure of the PLD.

FIG. 1 is a block diagram of a portion of a programmable logic device (PLD) including logic cell 100 and its connections to a first bus 102, shown vertically on the page, and a second bus 104, shown horizontally on the page. Input signals to logic cell 100 are supplied by horizontal bus 104 through buffers 106, while output signals from the logic cell 100 are transmitted through unidirectional repeaters 110 to vertical bus 102. The programmable BiCMOS unidirectional repeaters 110 can also selectively transfer data from vertical bus 102 to horizontal bus 104. In this embodiment, the fanout of each unidirectional repeater 110 is three, meaning that each repeater 110 can transfer data from one line of vertical bus 102 to three lines of horizontal bus 104. It should be understood that the fanout of unidirectional repeater 110 is implementation dependent.

BiCMOS bidirectional repeaters 112 are located on both vertical bus 102 and horizontal bus 104. In this embodiment, the bidirectional repeaters 112 are placed every fourth logic cell or block on vertical bus 102 and every third logic cell or block on horizontal bus 104. Once again, it should be understood that this feature of the architecture involving unidirectional repeaters 110 is implementation dependent.

In operation, selectively programmed unidirectional repeaters 110 transfer data from the vertical bus 102, which receives output signals from the logic cells 100, to the horizontal bus 104, which supplies inputs to the logic cells 100. Thus, for one logic cell to transfer data to another logic cell, the data must be placed on the vertical bus 102 at the output of the first cell, transferred through a unidirectional repeater 110 to the horizontal bus 104, then supplied as an input to the second logic cell. The operation of an individual unidirectional repeater 110 will be explained below.

Bidirectional repeaters 112 drive data in either direction along one bus, either vertical bus 102 or horizontal bus 104. The bidirectional repeaters 112 maintain signal integrity, which may otherwise be attenuated while propagating across long segments of a bus. Additionally, if a bidirectional repeater 112 is disabled, a section of logic cells 100 may be isolated from the other logic cells in the PLD. Isolation of a group of logic cells allows groups of cells to share the same bus without interfering with each other. Operation of an individual bidirectional repeater 112 will be explained below.

Figure 2:
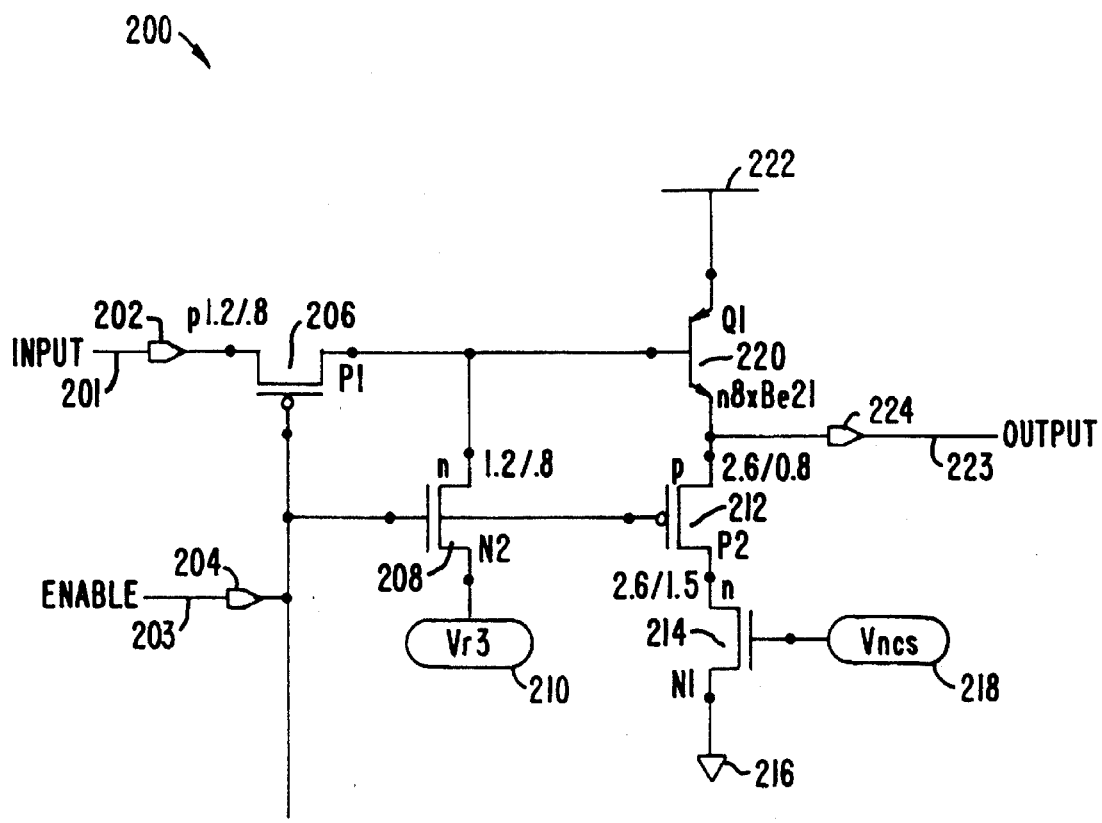
FIG. 2 is a schematic diagram showing a BiCMOS unidirectional repeater circuit.

FIG. 2 shows a schematic representation of a BiCMOS unidirectional repeater 200. Input terminal 202 is coupled to vertical bus 102 (shown in FIG. 1) and receives input signals 201 to unidirectional repeater 200. Programmable input 204 is connected to receive an enable signal 203 that enables operation of the unidirectional repeater 200. PMOS transistor 206 is coupled at its drain to input terminal 202 and at its gate to programmable input 204. NMOS transistor 208 is coupled at its gate to programmable input 204 and at its drain to the source of PMOS transistor 206. The source of NMOS transistor 208 is coupled to default voltage Vr3 210.

A second PMOS transistor 212 is also coupled at its gate to programmable input 204. A second NMOS transistor 214 acts as a current source and is coupled at its source to ground potential 216 and at its gate to a current source input voltage Vncs 218. The drain of NMOS transistor 214 is coupled to the source of PMOS transistor 212. Bipolar transistor 220 is coupled at its collector to power supply potential 222 and at its base to the drain of NMOS transistor 208. The emitter of bipolar transistor 220 is coupled to the drain of PMOS transistor 212. An output terminal 224 is also coupled to the emitter of bipolar transistor 220 for providing an output signal 223 from unidirectional repeater 200 to horizontal bus 104 (shown in FIG. 1).

In operation, the presence of an enable signal provided to programmable input 204 determines whether or not the repeater circuit will operate to reproduce at its output terminal 224 the input signal received at its input terminal 202.

If enable signal 203 is a logical LOW, the repeater circuit is enabled. A LOW enable signal 203 will turn ON PMOS transistor 206, providing a path for input signal 201 from input terminal 202 through bipolar transistor 220 to the output terminal 224. The LOW enable signal 203 also turns NMOS transistor 208 OFF and turns ON PMOS transistor 212, coupling the current source NMOS transistor 214 to the output terminal 224. This permits current source 214 to drive output signal 223 on the horizontal bus 104.

If enable signal 203 is at a logical HIGH level, PMOS transistor 206 is OFF, which cuts off the path for input signal 201. PMOS transistor 212 is also OFF, which keeps current source 214 from driving output signal 223. However, NMOS transistor 208 is now ON, setting the voltage at the base of bipolar transistor 220 to the default voltage Vr3 from node 210. The default voltage 210 is small enough to ensure that bipolar transistor 220 will not conduct. Thus, no connection between vertical bus 102 and horizontal bus 104 is established when enable signal 203 is HIGH.

Figure 3:
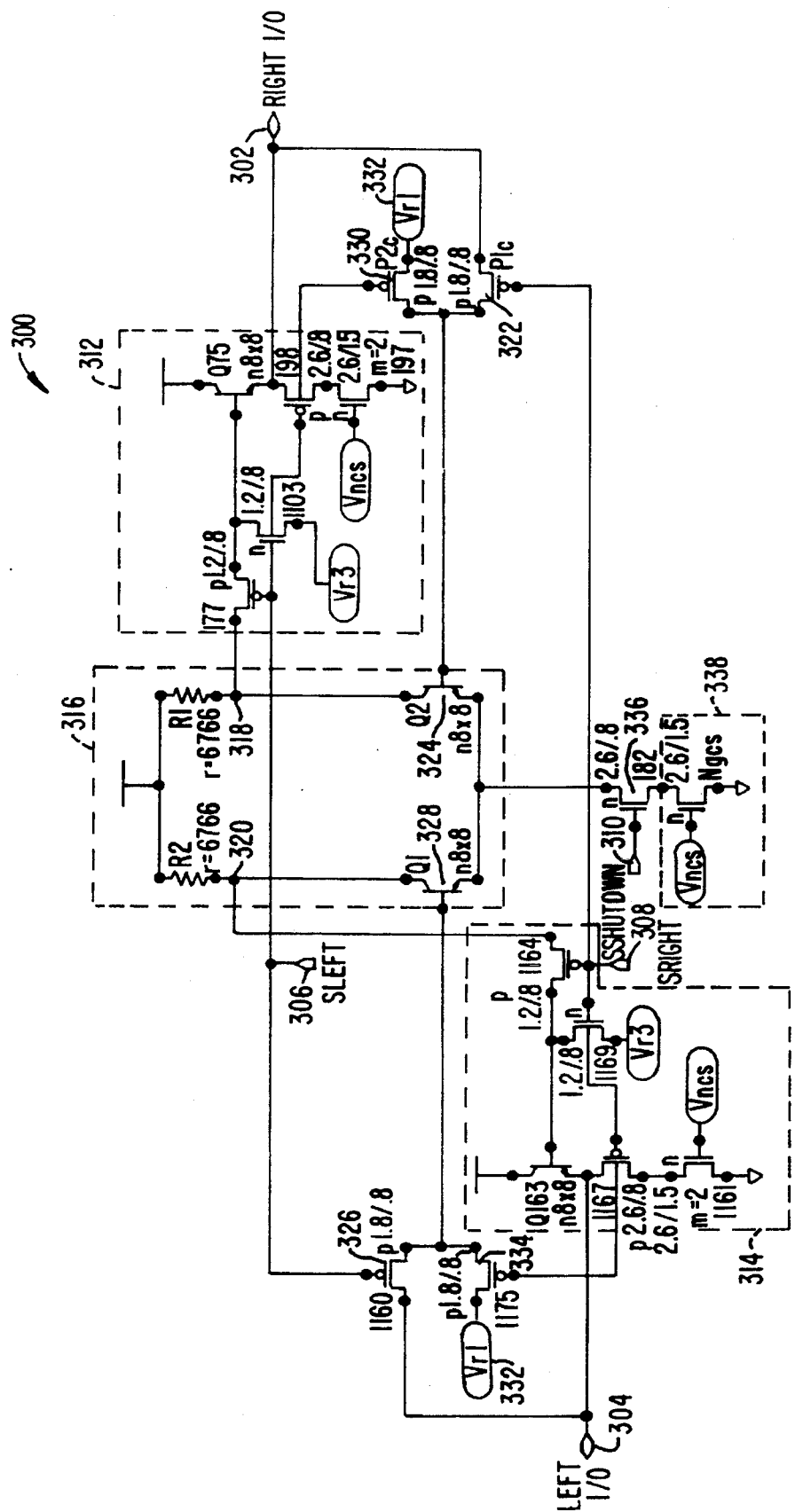
FIG. 3 is a schematic diagram showing a BiCMOS bidirectional repeater circuit for use in a single-ended PLD bus structure.

FIG. 3 shows a BiCMOS bidirectional repeater circuit 300 for use in a single-ended data bus in a PLD. A right input/output (I/O) terminal 302 transfers data to or receives data from a left input/output (I/O) terminal 304. A left select input 306 enables operation of bidirectional repeater 300 in one direction while a right select input 308 enables operation of bidirectional repeater 300 in the opposite direction. A shutdown input terminal 310 controls shutdown of the entire circuit.

Bidirectional repeater 300 includes two unidirectional repeater circuits 312 and 314, which are identical in design and operation to unidirectional repeater circuit 200 described in FIG. 2 above. The output terminal of repeater 312 is coupled to right I/O terminal 302, while the output terminal of repeater 314 is coupled to left I/O terminal 304. The programmable enable input terminal of repeater 312 is coupled to left select input terminal 306, while the programmable enable input of repeater 314 is coupled to right select input terminal 308. A current-mode logic (CML) differential amplifier 316 is connected between the two repeater circuits 312 and 314. The input terminal to repeater 312 is coupled to one output terminal 318 of CML amplifier 316 and the input terminal to repeater 314 is coupled to the other output terminal 320 of CML amplifier 316. The full circuit, including the CML amplifier and repeater circuits with emitter follower outputs, is a programmable emitter-coupled logic (ECL) circuit within a BiCMOS implementation of the invention.

A PMOS transistor 322 acts a pass transistor for right I/O terminal 302. The source of PMOS transistor 322 is coupled to right I/O terminal 302, while the drain is coupled to the first input terminal 324 of CML amplifier 316. The gate is controlled by select input 308. Similarly, PMOS transistor 326 is coupled at its source to left I/O terminal 304 and at its drain to the second input terminal 328 of CML amplifier 316. The gate of transistor 326 is controlled by left select input terminal 306.

A PMOS transistor 330 is coupled at its drain to the first input terminal 324 of CML amplifier 316, at its gate to left select input terminal 306 and at its source to a reference voltage Vr1 332. Similarly, PMOS transistor 334 is coupled at its drain to second input terminal 328 of CML amplifier 316, at its gate to right select input terminal 308 and at its source to reference voltage Vr1 332. Finally, an NMOS transistor 336 is coupled at its gate to shutdown input terminal 310, at its drain to the common emitter of CML amplifier 316 and at its source to an NMOS current source 338. Current source 338 is identical in design and operation to current source 214 in FIG. 2.

The operation of single-ended bidirectional repeater 300 will be explained for the case when left select input 306 is active (LOW) and right select input 308 is inactive (HIGH), so that the direction of data flow is into bidirectional repeater 300 through left I/O terminal 304 and out through right I/O terminal 302. It should be understood that operation of repeater 300 in the opposite direction will be substantially similar, where left select input 306 will be inactive, right select input 308 will be active, and the direction of data flow will be into right terminal 302 and out of left I/O terminal 304.

When the signal input to left select input 306 is LOW, unidirectional repeater 312 will be enabled and will provide at terminal 302 the input signal to the repeater 312 received from output node 318 of CML amplifier 316. PMOS transistor 326 will also be ON, providing a path for data input at left I/O terminal 304 to be fed to input node 328 of CML amplifier 316. PMOS transistor 330 will also be ON when left select input 306 is LOW, which provides a path for reference voltage Vr1 332 to be input to the other input node 324 of CML differential amplifier 316. Reference voltage 332 is set to a value at the midpoint between the logic HIGH and logic LOW levels of the input signal to left I/O terminal 304.

CML differential amplifier 316 operates in a well-known fashion. Specifically, if the input to node 328 from left I/O terminal 304 is HIGH, transistor Q1 will conduct, forcing amplifier output node 318 HIGH, which provides the input signal to repeater 312. As mentioned above, the output signal from repeater 312 appears at right I/O terminal 302, and a HIGH input signal at left terminal 304 therefore appears as a HIGH output at right terminal 302. If the input to node 328 is LOW, however, transistor Q1 will not conduct, forcing amplifier output node 318 LOW, which is provided to repeater 312. Then, the LOW input at left terminal 304 appears as a LOW output signal at right terminal 302.

Again, the reverse of the above-described process will be true if right select input terminal 308 is active (LOW) and left select input terminal 306 is inactive (HIGH). It should be stressed that it is not permitted to assert a LOW signal at both left select input 306 and right select input 308 simultaneously, as this would lead to bus contention. This condition is prevented from occurring by appropriate design of the logic circuits controlling the circuit of FIG. 3.

If the input to shutdown input terminal 310 is HIGH, bidirectional repeater 300 will operate as described above. A HIGH signal at terminal 310 will turn NMOS transistor 336 ON, permitting current source 338 to drive CML amplifier 316. If the input to shutdown terminal 310 is LOW, however, NMOS transistor 336 will be OFF, disconnecting the current source 338 from amplifier 316 and shutting down operation of the entire bidirectional repeater circuit 300. This condition isolates the two I/O terminals from each other. Under this condition, it is necessary to ensure left select input 306 and right select input 308 are each at a HIGH logic level to prevent a HIGH level being fed to the right I/O terminal and left I/O terminal, respectively.

Figure 4:
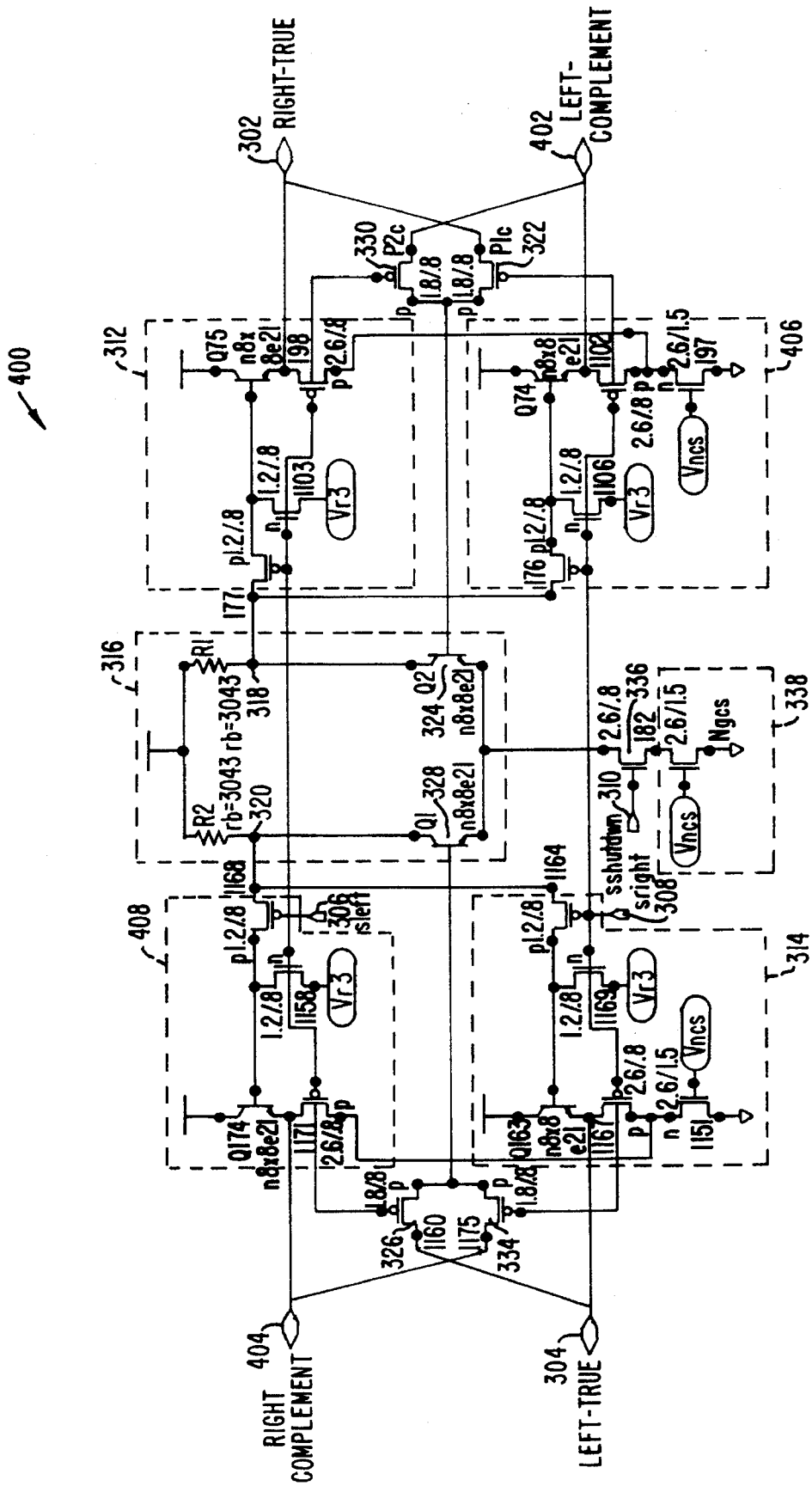
FIG. 4 is a schematic diagram showing a BiCMOS bidirectional repeater circuit for use in a differential PLD bus structure.

FIG. 4 shows a BiCMOS bidirectional repeater circuit 400 for use in a differential data bus in a PLD. The structure and operation of bidirectional repeater 400 are very similar to that of bidirectional repeater 300 in a single-ended bus. All elements from FIG. 3 that also appear in FIG. 4 have been given the same reference numerals. In addition to all of the elements shown in the repeater circuit of FIG. 3, bidirectional repeater 400 has appropriate additional elements that accommodate the transfer of data through the repeater on the complementary bus line of the differential line pair.

The complementary bus line is coupled to bidirectional repeater 400 through left complement I/O terminal 402 and right complement I/O terminal 404. Unidirectional repeater circuits 406 and 408 perform the same functions on the complementary bus line that repeater circuits 312 and 314 perform on the true bus line. The output of repeater 406 is coupled to left complement I/O terminal 402, while the output of repeater 408 is coupled to right complement I/O terminal 404. The programmable enable input of repeater 406 is coupled to right select input terminal 308, while the programmable enable input terminal of repeater 408 is coupled to left select input terminal 306. The input terminal to repeater 406 is coupled to output node 318 of CML amplifier 316, and the input node to repeater 408 is coupled to the other output node 320 of CML amplifier 316.

Reference voltage Vr1 332 (shown in FIG. 3) is not an element in bidirectional repeater 400. Instead, the complementary bus line is coupled to the appropriate PMOS transistor so that the signal on the complementary bus line, rather than reference voltage Vr1, is provided to CML differential amplifier 316. Accordingly, the source of PMOS transistor 330 is coupled to left complement I/O terminal 402 and the source of PMOS transistor 334 is coupled to right complement I/O terminal 404.

The operation of bidirectional repeater 400 in a differential bus is very similar to the operation of bidirectional repeater 300 in a single-ended bus. The details of operation will be explained below for the case when left select input terminal 306 is active (LOW) and right select input terminal 308 is inactive (HIGH), so that the direction of data flow is into bidirectional repeater 400 through left true I/O terminal 304 and left complement I/O terminal 402 and out of repeater 400 through right true I/O terminal 302 and right complement I/O terminal 404, respectively. It should be understood that operation of repeater 400 in the opposite direction will be substantially similar, where left select input terminal 306 will be inactive (HIGH), right select input terminal 308 will be active (LOW), and the direction of data flow will be into right true I/O terminal 302 and right complement I/O terminal 404 and out of left true I/O terminal 304 and left complement I/O terminal 402, respectively.

When the signal input to left select input 306 is LOW, unidirectional repeater 312 will be enabled and will output at terminal 302 the input to the repeater 312 received from output node 318 of CML amplifier 316. PMOS transistor 326 will also be ON, providing a path for data input at left true I/O terminal 304 to be fed to input node 328 of CML amplifier 316. PMOS transistor 330 will also be ON when left select input node or terminal signal 306 is LOW, which provides a path for data input at left complement I/O terminal 402 to be input to the other input node 324 of CML differential amplifier 316.

If the input node or terminal signal to amplifier input node 328 from left true I/O terminal 304 is HIGH and the input node or terminal signal to amplifier input node 324 from left complement terminal 402 is LOW, transistor Q1 will conduct and transistor Q2 will not conduct, forcing amplifier output node 318 HIGH and amplifier output node 320 LOW. The HIGH signal is supplied to repeater 312 and the LOW signal is supplied to repeater 408. As mentioned above, the output node or terminal from repeater 312 appears at right true I/O terminal 302. Thus, a HIGH input node or terminal at left true terminal 304 appears as a HIGH output node or terminal at right true terminal 302, and the complementary LOW input node or terminal at left complement terminal 402 appears as a LOW output node or terminal at right complement terminal 404.

If the input node or terminal signal to amplifier input node 328 from left true terminal 304 is LOW and the input node or terminal signal to amplifier input node 324 is HIGH, transistor Q1 will not conduct but transistor Q2 will. This will force amplifier output node 318 LOW and amplifier output node 320 HIGH. The HIGH signal is provided to repeater 408 and the LOW signal is provided to repeater 312. Then, the LOW input node or terminal signal at left true terminal 304 appears as a LOW output node or terminal signal at right true terminal 302, while the complementary HIGH input node or terminal signal at left complement terminal 402 appears as a HIGH output node or terminal signal at right complement terminal 404.

The reverse of the above-described process will be true if right select input node or terminal signal 308 is active (LOW) and left select input node or terminal signal 306 is inactive (HIGH). It should be stressed that, as in bidirectional repeater 300, it is not permitted to assert a LOW signal at both left select input 306 and right select input 308 in bidirectional repeater 400 simultaneously, as this would lead to bus contention.

The shutdown operation of bidirectional repeater 400 through shutdown input terminal 310 is like that outlined above for bidirectional repeater 300. Specifically, if the input to shutdown input node or terminal signal terminal 310 is HIGH, bidirectional repeater 400 will operate as outlined above. A HIGH signal at terminal 310 will turn NMOS transistor 336 ON, permitting current source 338 to drive CML amplifier 316. But if the input to shutdown terminal 310 is LOW, NMOS transistor 336 will be OFF, disconnecting the current source 338 from amplifier 316. In this case, left select input 306 and right select input 308 must each be at a HIGH logic level.

The invention has now been explained with reference to specific embodiments. Other embodiments will be apparent to those of ordinary skill in the art upon reference to the present description. It is therefore not intended that this invention be limited, except as indicated by the appended

What is claimed is:

1. A programmable logic device comprising:

a plurality of logic cells in which logic functions are performed;

a plurality of input lines for supplying signals to the plurality of logic cells;

a plurality of output lines for receiving signals from the plurality of logic cells;

a first potential source coupled to the plurality of logic cells;

a second potential source coupled to the plurality of logic cells; and a plurality of repeater circuits coupling the output lines to the input lines, the plurality of repeater circuits including bipolar and CMOS transistors.

2. The programmable logic device of claim 1 wherein each of the plurality of repeater circuits further comprises:

an input terminal for receiving an input signal;

an output terminal for providing an output signal;

an enabling input terminal for receiving an enable signal;

a plurality of CMOS transistors coupled to the input terminal and the enabling input terminal; and a bipolar transistor coupled to the plurality of CMOS transistors and to the output terminal.

3. The programmable logic device of claim 1 wherein each of the plurality of repeater circuits further comprises:

a first PMOS transistor having a drain coupled to the input terminal, a gate coupled to the programmable input and a source;

a first NMOS transistor having a drain coupled to the source of the first PMOS transistor, a gate coupled to the programmable input and a source coupled to a default voltage;

a second PMOS transistor having a gate coupled to the programmable input, a source and a drain;

a current source coupled to the source of the second PMOS transistor; and a bipolar transistor having a collector coupled to the power supply potential, a base coupled to the source of the first PMOS transistor and an emitter coupled to the drain of the second PMOS transistor.

4. The programmable logic device of claim 3 wherein the current source further comprises a second NMOS transistor having a drain coupled to the source of the second PMOS transistor, a gate coupled to a current source input voltage and a source coupled to the ground potential.

5. In a programmable logic device, a repeater circuit for producing an output signal from an input signal, the repeater circuit comprising:

an input terminal for receiving the input signal;

an output terminal for providing the output signal;

an enabling input terminal for receiving an enable signal;

a plurality of CMOS transistors coupled to the input terminal and the enabling input terminal; and a bipolar transistor coupled to the plurality of CMOS transistors and to the output terminal.

6. The programmable logic device of claim 5 wherein the repeater circuit further comprises:

a first PMOS transistor having a drain coupled to the input terminal, a gate coupled to the programmable input and a source;

a first NMOS transistor having a drain coupled to the source of the first PMOS transistor, a gate coupled to the programmable input and a source coupled to a default voltage;

a second PMOS transistor having a gate coupled to the programmable input, a source and a drain;

a current source coupled to the source of the second PMOS transistor; and a bipolar transistor having a collector coupled to a power supply potential, a base coupled to the source of the first PMOS transistor and an emitter coupled to the drain of the second PMOS transistor.

7. The programmable logic device of claim 6 wherein the current source further comprises a second NMOS transistor having a drain coupled to the source of the second PMOS transistor, a gate coupled to a current source input voltage and a source coupled to a ground potential.

8. In a programmable logic device, a bidirectional repeater circuit for producing an output signal from an input signal, the bidirectional repeater circuit comprising:

a plurality of input/output terminals for receiving input signals and providing output signals;

a plurality of programmable controllable input terminals for receiving direction control signals;

a plurality of BiCMOS unidirectional repeater circuits coupled to the plurality of input/output terminals; and a CML amplifier coupled to the plurality of BiCMOS unidirectional repeater circuits.

9. In a programmable logic device, a bidirectional repeater circuit for producing an output signal from an input signal, the bidirectional repeater circuit comprising:

a first input/output terminal for receiving the input signal and providing the output signal;

a second input/output terminal for receiving the input signal and providing the output signal;

a first programmable controllable input terminal for receiving a first direction control signal;

a second programmable controllable input terminal for receiving a second direction control signal;

a first BiCMOS unidirectional repeater circuit coupled to the first input/output terminal;

a second BiCMOS unidirectional repeater circuit coupled to the second input/output terminal; and a CML amplifier coupled between the first and second BiCMOS repeater circuits having a first and second input and a first and second output.

10. The bidirectional repeater circuit of claim 9 further comprising a shutdown circuit coupled to the CML amplifier for disabling the bidirectional repeater circuit.

11. The bidirectional repeater circuit of claim 10 further comprising:

a first PMOS transistor having a gate coupled to the first programmable controllable input terminal, a source coupled to a reference voltage and a drain coupled to the first input of the CML amplifier;

a second PMOS transistor having a gate coupled to the second programmable controllable input terminal, a source coupled to the first input/output terminal and a drain coupled to the first input of the CML amplifier;

a third PMOS transistor having a gate coupled to the first programmable controllable input terminal, a source coupled to the second input/output terminal and a drain coupled to the second input of the CML amplifier; and a fourth PMOS transistor having a gate coupled to the second programmable controllable input terminal, a source coupled to the reference voltage and a drain coupled to the second input of the CML amplifier.

12. In a programmable logic device, a bidirectional repeater circuit for producing an output signal from an input signal on a differential data bus, the bidirectional repeater circuit comprising:

a first input/output terminal for receiving the input signal and providing the output signal;

a second input/output terminal for receiving the input signal and providing the output signal;

a third input/output terminal for receiving the input signal and providing the output signal;

a fourth input/output terminal for receiving the input signal and providing the output signal;

a first programmable controllable input terminal for receiving a first direction control signal;

a second programmable controllable input terminal for receiving a second direction control signal;

a first BiCMOS unidirectional repeater circuit coupled to the first input/output terminal;

a second BiCMOS unidirectional repeater circuit coupled to the second input/output terminal;

a third BiCMOS unidirectional repeater circuit coupled to the third input/output terminal;

a fourth BiCMOS unidirectional repeater circuit coupled to the fourth input/output terminal; and a CML amplifier coupled the first, second, third and fourth BiCMOS unidirectional repeater circuits having a first and second input and a first and second output.

13. The bidirectional repeater circuit of claim 12 further comprising a shutdown circuit coupled to the CML amplifier for disabling the bidirectional repeater circuit.

14. The bidirectional repeater circuit of claim 13 further comprising:

a first PMOS transistor having a gate coupled to the first programmable controllable input terminal, a source coupled to the first input/output terminal and a drain coupled to the first input of the CML amplifier;

a second PMOS transistor having a gate coupled to the second programmable controllable input terminal, a source coupled to the second input/output terminal and a drain coupled to the first input of the CML amplifier;

a third PMOS transistor having a gate coupled to the first programmable controllable input terminal, a source coupled to the third input/output terminal and a drain coupled to the second input of the CML amplifier; and a fourth PMOS transistor having a gate coupled to the second programmable controllable input terminal, a source coupled to the fourth input/output terminal and a drain coupled to the second input of the CML amplifier.

15. A unidirectional repeater circuit for producing an output signal from an input signal, the unidirectional repeater circuit comprising:

an input terminal for receiving the input signal;

an output terminal for providing the output signal;

an enabling input terminal for receiving an enable signal;

a plurality of CMOS transistors coupled to the input terminal and the enabling input terminal; and a bipolar transistor coupled to the plurality of CMOS transistors and to the output terminal.

16. A bidirectional repeater circuit for producing an output signal from an input signal, the bidirectional repeater circuit comprising:

a first input/output terminal for receiving the input signal and providing the output signal;

a second input/output terminal for receiving the input signal and providing the output signal;

a first programmable controllable input terminal for receiving a first direction control signal;

a second programmable controllable input terminal for receiving a second direction control signal;

a first BiCMOS unidirectional repeater circuit coupled to the first input/output terminal;

a second BiCMOS unidirectional repeater circuit coupled to the second input/output terminal; and a CML amplifier coupled between the first and second BiCMOS unidirectional repeater circuits having a first and second input and a first and second output.

* * * * *